United States Patent
Wang et al.

(10) Patent No.: US 9,843,106 B2
(45) Date of Patent: Dec. 12, 2017

(54) INTEGRATED FAN OUT ANTENNA AND METHOD OF FORMING THE SAME

(71) Applicant: TAIWAN SEMICONDUCTOR MANUFACTURING COMPANY, LTD., Hsinchu (TW)

(72) Inventors: Chuei-Tang Wang, Taichung (TW); Jeng-Shieh Hsieh, Kaohisung (TW); Chung-Hao Tsai, Huatan Township (TW); Monsen Liu, Zhudong Township (TW); Chen-Hua Yu, Hinchu (TW)

(73) Assignee: TAIWAN SEMICONDCUTOR MANUFACTURING COMPANY, LTD., Hsinchu (TW)

( * ) Notice: Subject to any disclaimer, the term of this patent is extended or adjusted under 35 U.S.C. 154(b) by 153 days.

(21) Appl. No.: 14/510,796

(22) Filed: Oct. 9, 2014

(65) Prior Publication Data

US 2016/0104940 A1 Apr. 14, 2016

(51) Int. Cl.
| | | |
|---|---|---|
| *H01Q 21/00* | (2006.01) | |
| *H01Q 21/06* | (2006.01) | |
| *H01Q 1/22* | (2006.01) | |
| H01Q 19/00 | (2006.01) | |
| H01Q 19/10 | (2006.01) | |
| H01Q 19/185 | (2006.01) | |

(52) U.S. Cl.
CPC ........ *H01Q 21/065* (2013.01); *H01Q 1/2283* (2013.01); *H01Q 19/005* (2013.01); *H01Q 19/10* (2013.01); *H01Q 19/185* (2013.01)

(58) Field of Classification Search
USPC ........................... 343/702, 836, 834; 29/600
See application file for complete search history.

(56) References Cited

U.S. PATENT DOCUMENTS

| | | | | |
|---|---|---|---|---|
| 2001/0052645 A1* | 12/2001 | Op'T Eynde | ..... | H01L 23/49855 257/700 |
| 2012/0154238 A1* | 6/2012 | Carpentier | ......... | H01Q 21/0087 343/836 |

* cited by examiner

*Primary Examiner* — Jessica Han
*Assistant Examiner* — Hai Tran
(74) *Attorney, Agent, or Firm* — Hauptman Ham, LLP

(57) ABSTRACT

An integrated fan out (InFO) antenna includes a reflector on a surface of a substrate; and a package. The package includes a redistribution layer (RDL) arranged to form an antenna ground, and a patch antenna over the RDL, wherein the RDL is between the patch antenna and the reflector. The InFO antenna further includes a plurality of connecting elements bonding the package to the reflector. Each connecting element of the plurality of connecting elements is located inside an outer perimeter of the reflector. The InFO antenna is configured to output a signal having a wavelength.

20 Claims, 4 Drawing Sheets

INTEGRATED FAN OUT ANTENNA AND METHOD OF FORMING THE SAME

BACKGROUND

An integrated antenna includes an active circuit which generates a signal. The signal is then transferred to passive antenna elements electrically connected to the active circuit. The passive antenna includes a reflector on a printed circuit board (PCB) and a patch antenna on a package. The package is bonded to the PCB to space the reflector from the patch antenna. The reflector and patch antenna interact to transmit the signal to external devices.

Some passive antennas include an air cavity in the PCB. The air cavity includes sidewalls and a bottom surface lined with reflective material in order to form the reflector. Other passive antennas include a reflector on a surface of a PCB and the patch antenna in the package spaced from the reflector. The package is bonded to the PCB using solder ball surrounding the reflector and spaced from a perimeter of the reflector.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
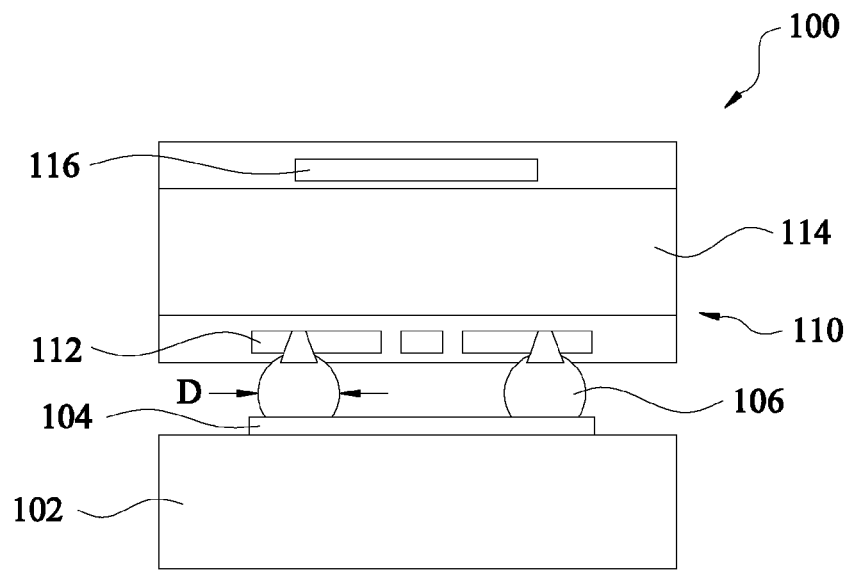
FIG. 1A is a cross-sectional view of an integrated fan out antenna in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a cross-sectional view of an integrated fan out (InFO) antenna 100 in accordance with some embodiments. InFO antenna 100 includes a substrate 102. A reflector 104 is on a surface of substrate 102. Connecting elements 106 are on a surface of reflector 104. Connecting elements 106 are located within a perimeter of reflector 104. Connecting elements 106 electrically connect substrate 102 to a package 110. Package 110 includes a redistribution layer (RDL) 112 electrically connected to connecting elements 106. RDL 112 is electrically connected to an active circuit (not shown). RDL 112 forms an antenna ground of InFO antenna 100. RDL 112 also forms a feed structure of InFO antenna 100, which includes a transmission line and a slot line. The feed structure is a portion of InFO antenna 100 which propagates radio waves to other components within the InFO antenna. A molding compound 114 is over RDL 112. A patch antenna 116 is over molding compound 114. Patch antenna 116 is above and is substantially centered over reflector 104. A pitch between connecting elements 106 helps to reduce a risk of signals reflected between patch antenna 116 and reflector 104 from passing between adjacent connecting elements.

Substrate 102 supports reflector 104. In some embodiments, substrate 102 includes active circuitry. In some embodiments, substrate 102 includes passive circuitry. In some embodiments, substrate 102 is a printed circuit board (PCB). In some embodiments, substrate 102 is an interposer.

Reflector 104 is configured to reflect a signal from the active circuit back toward package 110. Reflector 104 is on a surface of substrate 102 closest to package 110. In some embodiments, reflector 104 is on a surface of substrate 102 opposite package 110. Reflector 104 includes metal, metal alloy, or another suitable reflective element. In some embodiments, reflector 104 includes aluminum, copper, tungsten nickel, combinations thereof, or another suitable reflective material.

Reflector 104 has a rectangular shape. In some embodiments, reflector 104 is circular, triangular or another suitable shape. Reflector 104 has an area greater than antenna patch 116. The area of reflector 104 is less than the antenna ground formed by RDL 112. In some embodiments, reflector 104 has dimensions of about 1100 microns (μm)×about 1100 μm. In some embodiments, reflector 104 has dimensions of about 1300 μm×about 1300 μm. In some embodiments, reflector 104 has dimensions of about 1500 μm×about 1500 μm. In some embodiments, a diameter of reflector 104 ranges from about 1100 μm to about 1500 μm. If a dimension of reflector 104 is too small, the reflector will not be able to reflect a significant portion of the signal, in some embodiments. If a dimension of reflector 104 is too large, an overall size of InFO antenna 100 is increased without a significant increase in performance.

Connecting elements 106 are used to electrically and mechanically connect package 110 to substrate 102. Connecting elements 106 are located directly above reflector 104 inside an outer perimeter of the reflector. Connecting elements 106 are arranged around the periphery of reflector 104. In some embodiments, connecting elements 106 are solder balls. In some embodiments, connecting elements 106 are copper pillars. In some embodiments, connecting elements 106 include at least one under bump metallurgy (UBM) layer between the connecting elements and package 110. In some embodiments, the UBM layer includes a diffusion barrier layer to reduce material of connecting elements 106 from diffusing into package 110. In some embodiments, connecting elements 106 are in direct contact with reflector 104. In some embodiments, connecting elements 106 are separated from reflector 104 by a portion of substrate 102. In some embodiments, connecting elements 106 are separated from reflector 104 by at least one UBM layer.

A diameter D of connecting elements 106 is selected to help create a cavity between the antenna ground and reflector 104, in some embodiments. In some embodiments, the diameter D of connecting elements 106 ranges from about 200 μm to about 350 μm. In some embodiments, the diameter D of connecting elements 106 is about 250 μm. If the diameter D of connecting elements 106 is too small, the separation between package 110 and substrate 102 is not sufficient to establish a cavity for reflecting the signal, in some embodiments. If the diameter D of connecting elements D is too large, a risk of bridging between adjacent connecting elements increases; a size of InFO antenna 100 is increased; an area of reflector 104 occupied by connecting elements becomes too large for the reflector to function properly, in some embodiments. The pitch P (FIG. 1B) between adjacent connecting elements 106 helps to avoid the signal from passing between the adjacent connecting elements. In some embodiments, the pitch P is greater than about 1.5 times the diameter D of connecting elements 106. In some embodiments, the pitch P ranges from about 300 μm to about 550 μm. In some embodiments, the pitch P is about 400 μm. If the pitch P is too small, a risk of bridging between adjacent connecting elements 106 is increased, in some embodiments. If the pitch P is too large, a risk of the signal passing between adjacent connecting elements 106 increases, in some embodiments. A number of connective elements 106 in InFO antenna 100 is determined by a size of reflector 104, the diameter D of the connective elements, and the pitch P between adjacent connective elements. In some embodiments, a maximum number of connective elements 106 are formed directly above reflector 104. The maximum number of connective elements 106 is determined by a minimum spacing between adjacent connective elements 106 while avoiding bridging, i.e., short circuiting, between the adjacent connective elements. In some embodiments, the number of connective elements 106 is about 10. If the number of connecting elements 106 is too small, the risk of the signal passing between adjacent connecting elements increases. If the number of connecting elements 106 is too large, the risk of bridging between adjacent connecting elements increases, in some embodiments.

RDL 112 is connected to the active circuit. In addition, RDL 112 is the feeding structure of InFO antenna 100, as discussed above. RDL 112 is configured to convey the signal generated in the active circuit to InFO antenna 100. RDL 112 interacts with reflector 104 and patch antenna 116 to help produce the signal for propagation to external circuitry. In some embodiments, RDL 112 includes copper, aluminum, tungsten, combinations thereof or other suitable conductive elements.

Figure 1B:
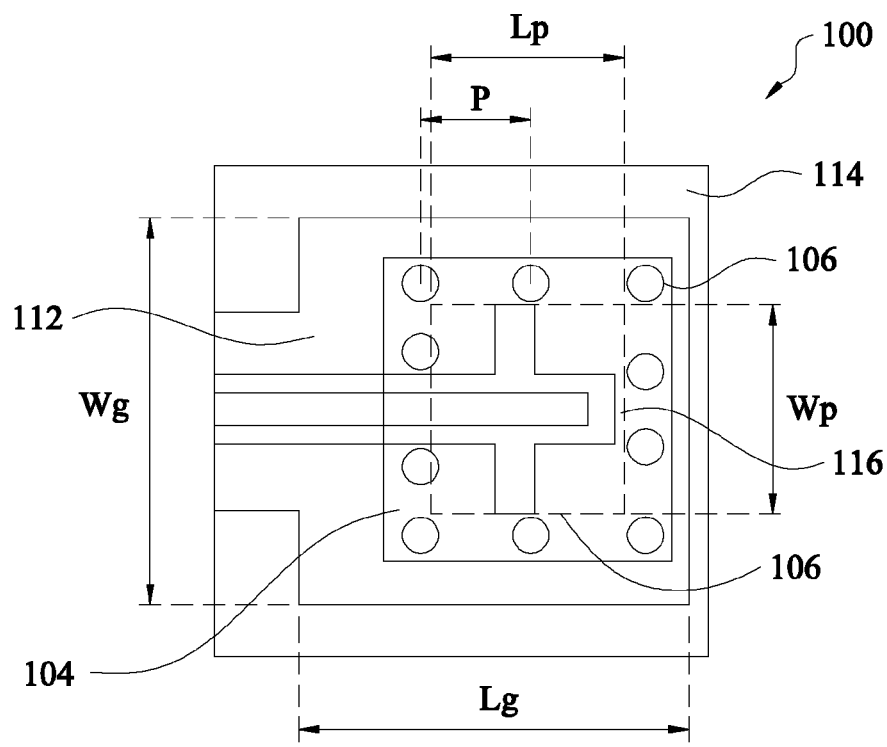
FIG. 1B is a bottom view of an integrated fan out antenna in accordance with some embodiments.

RDL 112 forms the antenna ground having an area greater than reflector 104. An outer perimeter of the antenna ground extends laterally beyond the outer perimeter of reflector 104 in all directions (FIG. 1B). The antenna ground has a rectangular shape. In some embodiments, the antenna ground is circular, triangular or another suitable shape. In some embodiments, the antenna ground has a same shape as reflector 104. In some embodiments, the antenna ground has a different shape from reflector 104. In some embodiments, a width Wg of the antenna ground is at least twice a width Wp of patch antenna 116. A length Lg of the antenna ground is at least twice a length Lp of patch antenna 116. In some embodiments, the antenna ground has dimensions of about 2000 μm×about 2000 μm. In some embodiments, a diameter of the antenna ground ranges from about 2000 μm to about 3500 μm. If dimensions of the antenna ground are too small, a strength of the signal conveyed from the active circuit will be reduced, in some embodiments. If dimensions of the antenna ground are too large, the overall size of InFO antenna 100 is increased without a significant increase in performance, in some embodiments.

Molding compound 114 is over RDL 112. Molding compound 114 is used to securely hold the active circuit to maintain connection with RDL 112. In some embodiments, an adhesive layer is located between molding compound 114 and RDL 112. In some embodiments, molding compound 114 has a dielectric constant ranging from about 3.1 to about 4.0. In some embodiments, molding compound 114 includes a molding underfill, an epoxy, a resin or another suitable molding material. In some embodiments, molding compound 114 includes a curable material, such as an infrared-curable material, an ultraviolet-curable material, or another suitable curable material.

Patch antenna 116 is above molding compound 114. Patch antenna 116 is substantially centered above the antenna ground. Patch antenna 116 includes a conductive material. In some embodiments, patch antenna 116 includes a metal, a metal alloy or another suitable conductive material. In some embodiments, patch antenna 116 includes aluminum, copper, tungsten, nickel, combinations thereof or another suitable material.

Patch antenna 116 has a rectangular shape. In some embodiments, patch antenna 116 is circular, triangular or another suitable shape. In some embodiments, patch antenna 116 has a same shape as at least one of reflector 104 or the antenna ground. In some embodiments, patch antenna 116 has a different shape from at least one of reflector 104 or the antenna ground. Dimensions of patch antenna 116 are selected based on a wavelength λ of the signal generated by the active circuity. In some embodiments, the wavelength λ of the signal ranges from about 4500 μm to about 5500 μm. In some embodiments, a frequency of the signal ranges from about 55 gigahertz (GHz) to about 65 GHz, i.e., a bandwidth of about 10 GHz. In some embodiment, a center frequency of the signal is about 60 GHz. A width Wp of patch antenna 116 ranges from about 1/10 λ to about 1/2 λ. A length Lp of patch antenna 116 ranges from about 1/10 λ to about 1/2 λ. In some embodiments, patch antenna 116 has dimensions of about 1000 μm×about 1000 μm. In some embodiments, a diameter of patch antenna 116 ranges from about 500 μm to about 2500 μm. If dimensions of patch antenna 116 are too small, the patch antenna 116 will not efficiently radiate the signal, in some embodiments. If dimensions of patch antenna 116 are too large, the overall size of InFO antenna 100 is increased without a significant increase in performance, in some embodiments.

In comparison with some other approaches, InFO antenna 100 avoids complicated patterning to form a cavity within substrate 102. InFO antenna 100 includes reflector 104 smaller than the antenna ground. The size of reflector 104 provides a functioning device having a smaller area in comparison with approaches which include solder balls outside a perimeter of a reflector. The structure of InFO antenna 100 also helps to provide isolation between antenna elements to enhance array gain. For example, InFO antenna exhibits a gain of approximately 4 dBi. In contrast, a device which includes solder balls outside the perimeter of the reflector exhibits a gain of approximately 1.5 dBi.

FIG. 1B is a bottom view of InFO antenna 100 in accordance with some embodiments. FIG. 1B includes the same elements as FIG. 1A. The antenna ground formed by RDL 112 has width Wg and length Lg. In some embodiments, the antenna ground includes a diameter approximately equal to width Wg or length Lg. The dimensions of the antenna ground are greater than the dimensions of reflector 104. Connecting elements 106 are arranged over reflector 104 within the perimeter of the reflector 104. The pitch P between connecting elements 106 helps to prevent the signal reflected between reflector 104 and antenna ground from passing between adjacent connecting elements. Patch antenna 116 has dimensions less than reflector 104. Patch antenna 116 has width Wp and length Lp. In some embodiments, patch antenna 116 includes a diameter approximately equal to width Wp or length Lp.

Figure 2A:
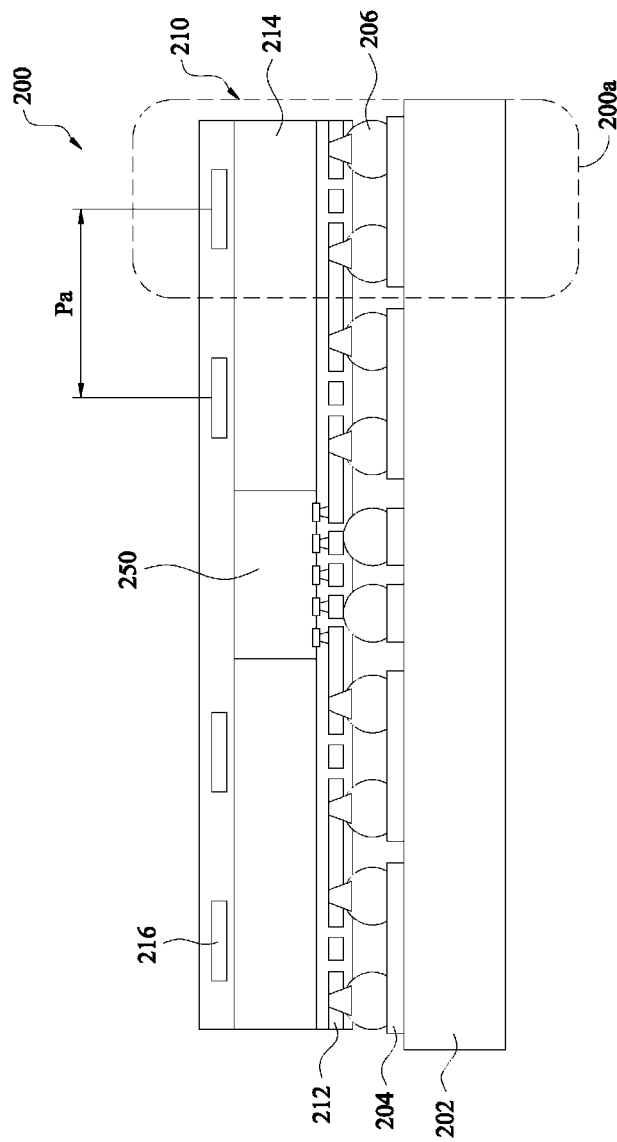
FIG. 2A is a cross-sectional view of an integrated fan out antenna array in accordance with some embodiments.

FIG. 2A is a cross-sectional view of an InFO antenna array 200 in accordance with some embodiments. InFO antenna array 200 includes similar elements as InFO antenna 100 (FIG. 1A). Similar elements have a same reference number increased by 100. InFO antenna array 200 includes a plurality of InFO antennas 200a, e.g., InFO antenna 100. In some embodiments, the plurality of InFO antennas 200a is arranged in rectangular pattern, e.g., 4×1; 2×2; 8×1; 4×2; 16×1; 8×2; 4×4; or another suitable rectangular pattern. In some embodiments, the plurality of InFO antennas 200a is arranged in a circular, triangular or another suitable pattern. In some embodiments, the plurality of InFO antenna 200a is arranged in an irregular arrangement. In some embodiments, an array pitch Pa between adjacent InFO antennas 200a is greater than about ¼ λ. In some embodiments, the array pitch Pa ranges from about 1100 μm to about 2200 μm. If the array pitch Pa is too small, one InFO antenna 200a may adversely impact operations of an adjacent InFO antenna, in some embodiments. If the array pitch Pa is too large, a size of InFO antenna array 200 is increased without significant increase in performance, in some embodiments.

In some embodiments, dimensions of InFO antenna 200a ranges from about 10,000 μm to about 15,000 μm. In some embodiments, dimensions of InFO antenna 200a are less than about 20,000 μm. If the dimensions of InFO antenna 200a are too small, the InFO antenna will not efficiently transmit the signal from the active circuit, in some embodiments. If the dimensions of InFO antenna 200a are too large, a size of InFO antenna array 200 is increased without significant increase in performance, in some embodiments.

In comparison with InFO antenna 100, InFO antenna array 200 includes active circuit 250. Active circuit 250 is configured to generate the signal transferred to RDL 212. Molding compound 214 helps to secure active circuit 250 in place to maintain electrical connection with RDL 212 for each InFO antenna 200a, in some embodiments, active circuit 250 is electrically connected to active elements in substrate 202. In some embodiments, active circuit 250 is electrically connected to passive elements in substrate 202. In some embodiments, active circuit 250 is configured to generate the signal in response to a prompt from an external circuit. In some embodiments, active circuit 250 is configured to generate the signal having a frequency ranging from about 55 GHz to about 65 GHz. In some embodiments, dimensions of active circuit 250 range from about 2000 μm to about 4000 μm. In some embodiments, InFO antenna array 200 exhibits a gain of approximately 14 dBi.

Figure 2B:
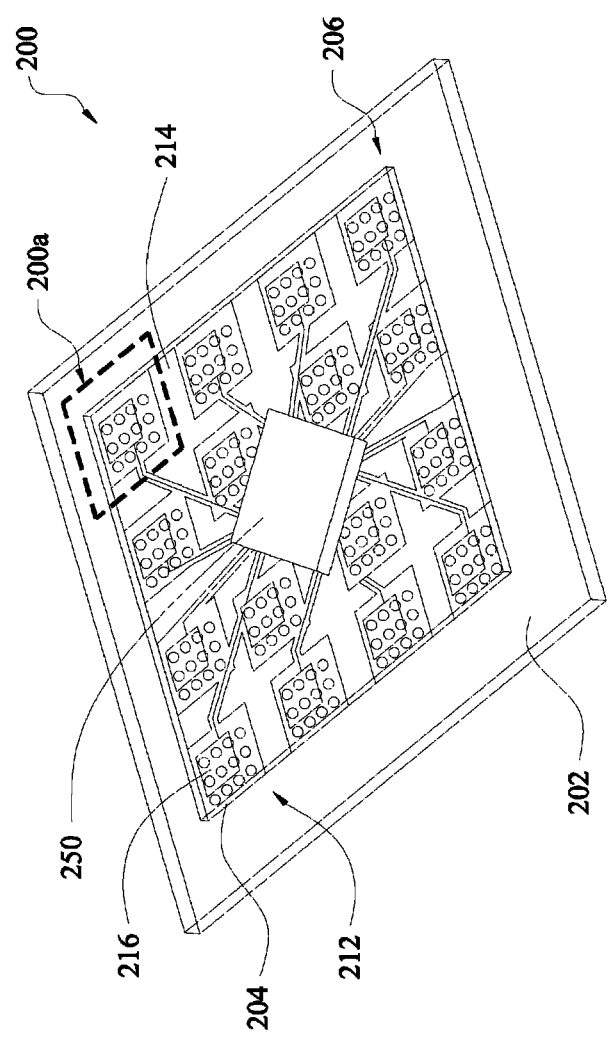
FIG. 2B is a perspective view of an integrated fan out antenna array in accordance with some embodiments.

FIG. 2B is a perspective view of InFO antenna array 200 in accordance with some embodiments. FIG. 2B includes a 4×4 array of InFO antennas 200a. In some embodiments, a number or arrangement of InFO antennas 200a is different from the arrangement of FIG. 2B. Active circuit 250 is located at a center point of the array of InFO antennas 200a. In some embodiments, active circuit 250 is located at a position other than the center point of the array of InFO antennas 200a.

Figure 3:
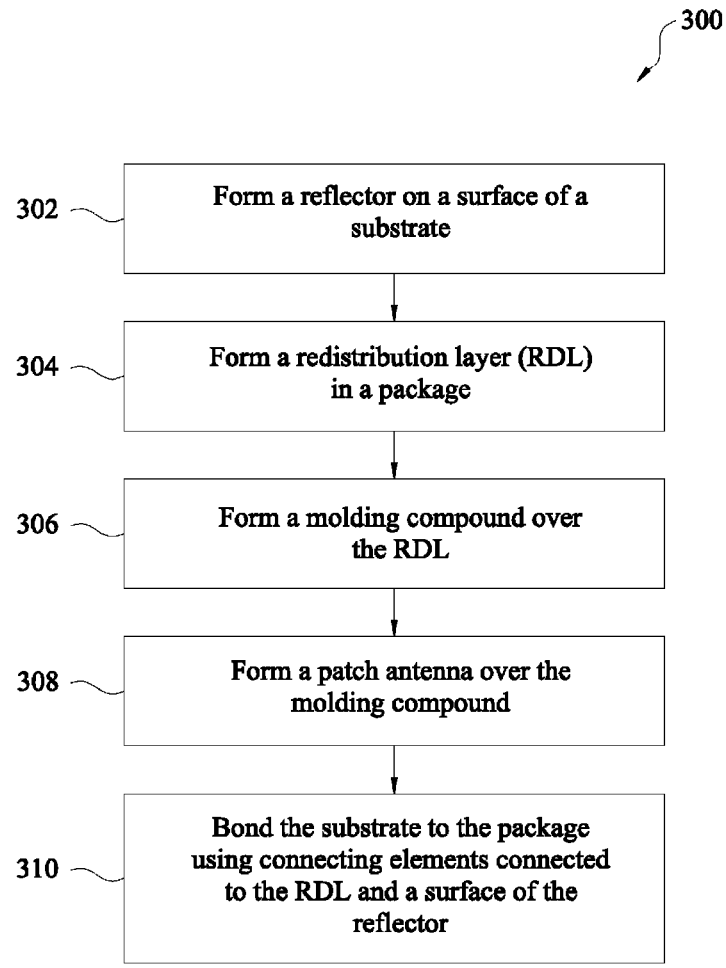
FIG. 3 is a flowchart of a method of making an integrated fan out antenna in accordance with some embodiments.

FIG. 3 is a flowchart of a method 300 of making an integrated fan out antenna in accordance with some embodiments. In operation 302, a reflector is formed on a surface of the substrate. The reflector, e.g., reflector 104 (FIG. 1A), includes a reflective material. In some embodiments, the reflector includes a metal or metal alloy. In some embodiments, the reflector is formed by physical vapor deposition (PVD), chemical vapor deposition (CVD), sputtering, plating, or another suitable formation process. In some embodiments, the substrate, e.g., substrate 102, is a PCB, an interposer, or another suitable substrate.

In operation 304, a redistribution layer (RDL), is formed in a package. The RDL, e.g., RDL 112 (FIG. 1A), is used to form an antenna ground in the package, e.g., package 110. An area of the antenna ground is greater than an area of the reflector. The RDL is connected to an active circuit, e.g., active circuit 250 (FIG. 2A), which is configured to generate a signal. The RDL is configured to convey the signal from the active circuit to the antenna ground. In some embodiments, the RDL includes a metal or a metal alloy. In some embodiments, a material of the RDL is a same material as the reflector. In some embodiments, the material of the RDL is different from the material of the reflector. In some embodiments, the RDL is formed by performing an etching process on a dielectric material to form openings within the dielectric material. The RDL is then formed within the openings in the dielectric material. In some embodiments, the RDL is formed within the openings in the dielectric material by PVD, CVD, sputtering, plating or another suitable formation process. In some embodiments, the RDL is formed using a same process as the reflector. In some embodiments, the RDL is formed using a different process from the reflector.

A molding compound is formed over the RDL in operation 306. The molding compound, e.g., molding compound 114 (FIG. 1A), is used to secure the location of the active circuit. In some embodiments, the molding compound includes an underfill, an epoxy, a resin or another suitable material. In some embodiments, a dielectric constant of the molding compound ranges from about 3.1 to about 4.0. In some embodiments, the molding compound is formed by injection or another filling process. In some embodiments, the molding compound is cured following introduction of the molding compound. In some embodiments, the molding compound is cured by infrared radiation, ultraviolet radiation, or other suitable radiation.

In operation 308, a patch antenna is formed over the molding compound. The patch antenna, e.g., patch antenna 116 (FIG. 1A), is configured to transmit the signal generated by the active circuit to external circuitry. An area of the patch antenna is less than an area of the antenna ground and the reflector. In some embodiments, the patch antenna includes a metal or a metal alloy. In some embodiments, a material of the patch antenna is a same material as at least one of the reflector or the RDL. In some embodiments, the material of the patch antenna is different from the material of at least one of the reflector or the RDL. In some embodiments, the patch antenna is formed by performing an etching process on a dielectric material to form openings within the dielectric material. The patch antenna is then formed within the openings in the dielectric material. In some embodiments, the patch antenna is formed within the openings in the dielectric material by PVD, CVD, sputtering, plating or another suitable formation process. In some embodiments, the patch antenna is formed using a same process as at least one of the reflector or the RDL. In some embodiments, the patch antenna is formed using a different process from at least one of the reflector or the RDL.

In operation 310, the package is bonded to the substrate using connecting elements connected to the RDL and to a surface of the reflector. The connecting elements, e.g., connecting elements 106 (FIG. 1A), are located within a perimeter of the reflector. The connecting elements are used to electrically and mechanically connect the package to the substrate. In some embodiments, the connecting elements are solder balls. In some embodiments, the connecting elements are copper pillars. In some embodiments, the connecting elements include at least one UBM layer between the connecting elements and package. In some embodiments, the connecting elements are in direct contact with the reflector. In some embodiments, the connecting elements are separated from the reflector by a portion of the substrate or at least one UBM layer.

A diameter D of the connecting elements is selected to help create a cavity between the antenna ground and the reflector. A pitch between adjacent connecting elements helps to prevent the signal from passing between the adjacent connecting elements. A number of the connective elements is determined by a size of the reflector, the diameter of the connective elements, and the pitch between adjacent connective elements.

In some embodiments, the connective elements are formed by a screening process, a printing process, a plating process, CVD, PVD, sputtering, or another suitable formation process. In some embodiments, the connective elements are formed by a same process as at least one of the reflector, the RDL or the patch antenna. In some embodiments, the connective elements are formed by a different process from at least one of the reflector, the RDL, or the patch antenna. In some embodiments, the package is bonded to the substrate by a reflow process. In some embodiments, the package is bonded to the substrate by a eutectic bonding process.

In some embodiments, an order of operations of method 300 is altered. For example, the molding compound is formed prior to forming the RDL, in some embodiments. In some embodiments, additional operations are added to method 300. For example, bonding the active circuit to the RDL is included in method 300, in some embodiments. In some embodiments, at least operation of method 300 is omitted. For example, the molding compound is omitted, in some embodiments.

One aspect of this description relates to an integrated fan out (InFO) antenna. The InFO antenna includes a reflector on a surface of a substrate; and a package. The package includes a redistribution layer (RDL) arranged to form an antenna ground, and a patch antenna over the RDL, wherein the RDL is between the patch antenna and the reflector. The InFO antenna further includes a plurality of connecting elements bonding the package to the reflector. Each connecting element of the plurality of connecting elements is located inside an outer perimeter of the reflector. The InFO antenna is configured to output a signal having a wavelength.

Another aspect of this description relates to an integrated fan out (InFO) antenna array. The InFO antenna array includes a substrate; and an active circuit configured to generate a signal having a wavelength. The active circuit is part of a package. The InFO antenna array further includes a plurality of InFO antennas connected to the active circuit. Each InFO antenna of the plurality of InFO antennas includes a reflector on a surface of the substrate; and a redistribution layer (RDL) arranged to form an antenna ground in the package, wherein the RDL is connected to the active circuit. Each InFO antenna of the plurality of InFO antennas further includes a patch antenna in the package over the RDL; and a plurality of connecting elements bonding the RDL to the reflector. Each connecting element of the plurality of connecting elements is located inside an outer perimeter of the reflector.

Still another aspect of this description relates to a method of making an integrated fan out (InFO) antenna. The method includes forming a reflector on a surface of a substrate. The method further includes forming a redistribution layer (RDL) in a package, wherein forming the RDL comprises forming an antenna ground. The method further includes forming a patch antenna over the RDL, wherein the RDL is between the patch antenna and the reflector. The method further includes bonding the package to the reflector using a plurality of connecting elements. Each connecting element of the plurality of connecting elements is located directly above the reflector. The InFO antenna is configured to output a signal having a wavelength.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan out (InFO) antenna comprising:
   a reflector on a surface of a substrate;
   a package, the package comprising:
      a redistribution layer (RDL) arranged to form an antenna ground, and
      a patch antenna over the RDL, wherein the RDL is between the patch antenna and the reflector, an area of the entire antenna ground is greater than an area of the entire reflector, and the RDL at least partially overlaps the patch antenna; and
   a plurality of connecting elements bonding the package to the reflector, wherein each connecting element of the plurality of connecting elements is located inside an outer perimeter of the reflector, and the InFO antenna is configured to output a signal having a wavelength.

2. The InFO antenna of claim 1, wherein at least one connecting element of the plurality of connecting element is in direct contact with the reflector.

3. The InFO antenna of claim 1, wherein the connecting elements are regularly arranged and a pitch between adjacent connecting elements of the plurality of connecting elements blocks the signal from passing between the adjacent connecting elements.

4. The InFO antenna of claim 1, wherein an area of the reflector is greater than an area of the patch antenna.

5. The InFO antenna of claim 1, wherein the connecting elements are regularly arranged and a pitch between adjacent connecting elements of the plurality of connecting elements is greater than about 1.5 times a diameter of at least one connecting element of the plurality of connecting elements.

6. The InFO antenna of claim 1, wherein a dimension of the patch antenna ranges from about 1/10 $\lambda$, to about 1/2 $\lambda$, where $\lambda$ is the wavelength of the signal.

7. The InFO antenna of claim 1, wherein a dimension of the antenna ground is at least twice a dimension of the patch antenna.

8. The InFO antenna of claim 1, further comprising a molding compound between the RDL and the patch antenna.

9. The InFO antenna of claim 1, wherein at least one connecting element of the plurality of connecting elements is electrically connected to the RDL.

10. The InFO antenna of claim 1, wherein each connecting element of the plurality of connecting elements extends beyond an edge of the patch antenna in a top view.

11. The InFO antenna of claim 1, wherein the RDL comprises a feed structure for the InFO antenna, and the feed structure comprises a transmission line and a slot line.

12. An integrated fan out (InFO) antenna array comprising:
 a substrate;
 an active circuit configured to generate a signal having a wavelength, wherein the active circuit is part of a package; and
 a plurality of InFO antennas electrically connected to the active circuit, wherein each InFO antenna of the plurality of InFO antennas comprises:
  a reflector on a surface of the substrate;
  a redistribution layer (RDL) arranged to form an antenna ground in the package, wherein the RDL is electrically connected to the active circuit,
  a patch antenna in the package over the RDL, wherein the RDL at least partially overlaps the patch antenna, and a dimension of the antenna ground is at least twice a dimension of the patch antenna; and
  a plurality of connecting elements bonding the RDL to the reflector, wherein each connecting element of the plurality of connecting elements is located inside an outer perimeter of the reflector.

13. The InFO antenna array of claim 12, further comprising a molding compound surrounding the active circuit.

14. The InFO antenna array of claim 12, wherein the plurality of InFO antennas is arranged in a regular pattern.

15. The InFO antenna array of claim 12, wherein a pitch between adjacent connecting elements of the plurality of connecting elements blocks the signal from passing between the adjacent connecting elements.

16. The InFO antenna array of claim 12, wherein a pitch between adjacent connecting elements of the plurality of connecting elements is greater than about 1.5 times a diameter of at least one connecting element of the plurality of connecting elements.

17. The InFO antenna array of claim 12, wherein a dimension of the patch antenna ranges from about 1/10 $\lambda$ to about 1/2 $\lambda$, where $\lambda$ is the wavelength of the signal.

18. A method of making an integrated fan out (InFO) antenna, the method comprising:
 forming a reflector on a surface of a substrate, wherein the reflector is a continuous plate;
 forming a redistribution layer (RDL) in a package, wherein forming the RDL comprises forming an antenna ground,
 forming a patch antenna over the RDL, wherein the RDL is between the patch antenna and the reflector, and the RDL at least partially overlaps the patch antenna; and
 bonding the package to the reflector using a plurality of connecting elements, wherein each connecting element of the plurality of connecting elements is located above the reflector, and the InFO antenna is configured to output a signal having a wavelength.

19. The method of claim 18, wherein bonding the package to the reflector comprises using the plurality of connecting elements having a pitch between adjacent connecting elements of the plurality of connecting elements blocks the signal from passing between the adjacent connecting elements.

20. The method of claim 18, wherein bonding the package to the reflector comprises using the plurality of connecting elements having a pitch between adjacent connecting elements of the plurality of connecting elements greater than about 1.5 times a diameter of at least one connecting element of the plurality of connecting elements.

* * * * *